United States Patent
Robertson, Jr. et al.

(10) Patent No.: US 11,579,252 B2
(45) Date of Patent: Feb. 14, 2023

(54) SENSOR-COOLING APPARATUS

(71) Applicant: Ford Global Technologies, LLC, Dearborn, MI (US)

(72) Inventors: Michael Robertson, Jr., Garden City, MI (US); Tyler D. Hamilton, Farmington, MI (US); Ashwin Arunmozhi, Canton, MI (US); Raghu Raman Surineedi, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 620 days.

(21) Appl. No.: 16/595,581

(22) Filed: Oct. 8, 2019

(65) Prior Publication Data
US 2021/0103036 A1  Apr. 8, 2021

(51) Int. Cl.
G01S 7/481 (2006.01)
F28F 3/02 (2006.01)
G01S 7/483 (2006.01)
H01L 23/467 (2006.01)
G01S 7/497 (2006.01)
G01S 13/931 (2020.01)

(52) U.S. Cl.
CPC ............ *G01S 7/4813* (2013.01); *F28F 3/025* (2013.01); *G01S 7/483* (2013.01); *H01L 23/467* (2013.01); *G01S 2007/4977* (2013.01); *G01S 2013/93271* (2020.01)

(58) Field of Classification Search
CPC .................. G01S 7/4813; G01S 7/483; G01S 2013/93271; G01S 2007/4977; F28F 3/025; H01L 23/467
USPC ......................................................... 356/4.01
See application file for complete search history.

(56) References Cited

U.S. PATENT DOCUMENTS

| | | | | |
|---|---|---|---|---|
| 8,072,613 B2 * | 12/2011 | Schmitz | ................ | G01B 11/24 356/601 |
| 8,699,007 B2 * | 4/2014 | Becker | ................ | G01C 15/002 356/5.1 |
| 8,730,477 B2 * | 5/2014 | Ruhland | ................ | G01S 17/42 356/402 |
| 8,743,347 B1 * | 6/2014 | Corella | ................ | G01S 7/495 356/3.01 |
| 9,538,054 B2 * | 1/2017 | Hayakawa | ............... | B60S 1/56 |
| 10,295,656 B1 * | 5/2019 | Li | ........................ | G01S 7/4813 |
| 10,589,723 B1 * | 3/2020 | Dubey | ................ | G01S 17/931 |
| 10,744,979 B2 * | 8/2020 | Schmidt | .................... | B60S 1/52 |
| 10,953,809 B2 * | 3/2021 | Krishnan | ............. | G05D 1/0088 |
| 11,055,532 B2 * | 7/2021 | Frank | ........................ | G06T 7/70 |

(Continued)

FOREIGN PATENT DOCUMENTS

CN 108761471 A 11/2018
EP 2605043 B1 7/2014

*Primary Examiner* — Tho V Duong
*Assistant Examiner* — Raheena R Malik
(74) *Attorney, Agent, or Firm* — Frank A. MacKenzie; Bejin Bieneman PLC

(57) ABSTRACT

A sensor apparatus includes a sensor having a field of view, a sensor window through which the field of view extends; an air nozzle positioned to direct airflow across the sensor window; a surface fixed relative to the sensor window, the surface including a plurality of heat-dissipation fins; and a cover extending over the fins and including an inlet. The inlet is positioned at an opposite edge of the sensor window from the air nozzle. The air nozzle is aimed at the inlet.

14 Claims, 5 Drawing Sheets

(56) References Cited

U.S. PATENT DOCUMENTS

| | | | |
|---|---|---|---|
| 11,099,039 B2* | 8/2021 | Krishnan | G01L 19/14 |
| 11,237,028 B1* | 2/2022 | Surineedi | H05K 7/20336 |
| 2011/0073142 A1* | 3/2011 | Hattori | B60S 1/481 |
| | | | 134/198 |
| 2012/0019806 A1* | 1/2012 | Becker | G01C 15/002 |
| | | | 356/4.01 |
| 2012/0162428 A1 | 6/2012 | Wee | |
| 2015/0168555 A1* | 6/2015 | Herschbach | G01S 17/89 |
| | | | 356/5.01 |
| 2015/0296108 A1* | 10/2015 | Hayakawa | B60R 1/00 |
| | | | 348/148 |
| 2018/0361997 A1 | 12/2018 | Schmidt et al. | |
| 2021/0063093 A1* | 3/2021 | Tobiassen | G01S 17/931 |
| 2021/0103036 A1* | 4/2021 | Robertson, Jr. | G01S 7/483 |
| 2021/0215803 A1* | 7/2021 | Zhou | G01S 7/4813 |
| 2021/0333406 A1* | 10/2021 | Lee | G01S 7/4813 |
| 2021/0405198 A1* | 12/2021 | Graf | G01S 7/4817 |
| 2022/0043120 A1* | 2/2022 | Baldovino | G01S 7/4813 |

* cited by examiner

SENSOR-COOLING APPARATUS

BACKGROUND

Autonomous vehicles include a variety of sensors. Some sensors detect internal states of the vehicle, for example, wheel speed, wheel orientation, and engine and transmission variables. Some sensors detect the position or orientation of the vehicle, for example, global positioning system (GPS) sensors; accelerometers such as piezoelectric or microelectromechanical systems (MEMS); gyroscopes such as rate, ring laser, or fiber-optic gyroscopes; inertial measurements units (IMU); and magnetometers. Some sensors detect the external world, for example, radar sensors, scanning laser range finders, light detection and ranging (LIDAR) devices, and image processing sensors such as cameras. A LIDAR device detects distances to objects by emitting laser pulses and measuring the time of flight for the pulse to travel to the object and back. Some sensors are communications devices, for example, vehicle-to-infrastructure (V2I) or vehicle-to-vehicle (V2V) devices.

DETAILED DESCRIPTION

Figure 1:
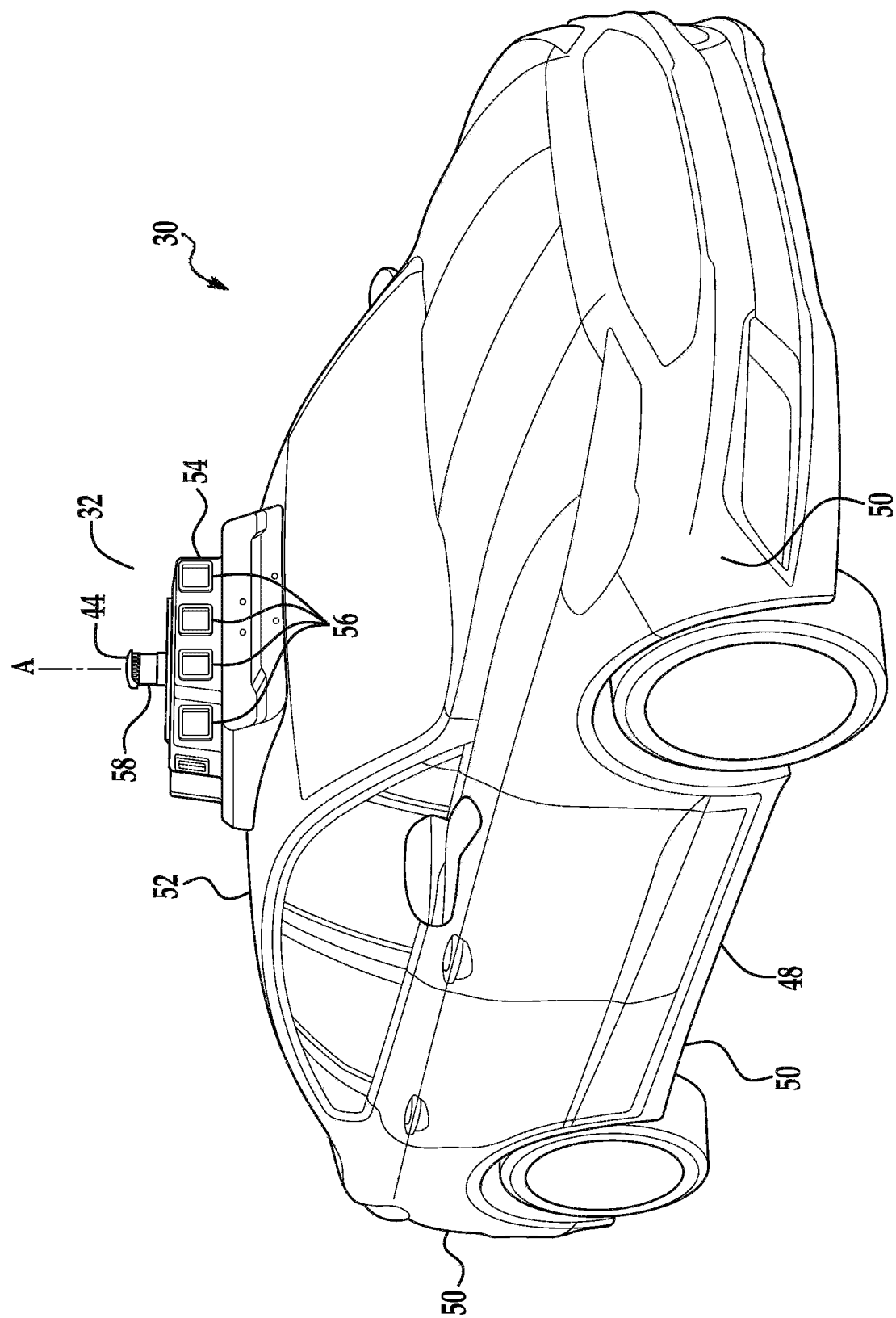
FIG. 1 is a perspective view of an example vehicle including a housing for sensors.

A sensor apparatus includes a sensor having a field of view; a sensor window through which the field of view extends; an air nozzle positioned to direct airflow across the sensor window; a surface fixed relative to the sensor window, the surface including a plurality of heat-dissipation fins; and a cover extending over the heat-dissipation fins and including an inlet. The inlet is positioned at an opposite edge of the sensor window from the air nozzle, and the air nozzle is aimed at the inlet.

The air nozzle may be open to an ambient environment, and the inlet may be open to the ambient environment.

The cover may include an outlet and may form an airflow path between the inlet and the outlet, and the fins may be elongated along the airflow path. The sensor window may be mounted to a body panel of a vehicle, and the fins may be elongated along a vehicle-forward direction. The outlet may face in the vehicle-forward direction.

The surface may be positioned to receive heat generated by the sensor.

The sensor window may be cylindrical. The sensor window may define an axis, and the surface may be centered on the axis. The surface may be oriented orthogonal to the axis.

The sensor window may extend vertically from a bottom edge to a top edge. The air nozzle may be positioned at the bottom edge, and the inlet may be positioned at the top edge.

The sensor window may be unobstructed from the bottom edge to the top edge.

The sensor apparatus may further include a sensor-housing top including the surface, and the sensor-housing top may be mounted to the sensor window. The sensor window may extend vertically from a bottom edge to a top edge, the sensor-housing top may include a lateral surface extending vertically upward from the top edge of the sensor window, and the surface may extend transverse from the lateral surface. The cover may extend from the inlet over the lateral surface and may form an airflow path from the inlet to the fins.

A contour of the cover may match a contour of the surface.

With reference to the Figures, a sensor apparatus 32 for a vehicle 30 includes a sensor 34 having a field of view, a sensor window 36 through which the field of view extends; a first air nozzle 38 positioned to direct airflow across the sensor window 36; a surface 40 fixed relative to the sensor window 36, the surface 40 including a plurality of heat-dissipation fins 42; and a cover 44 extending over the heat-dissipation fins 42 and including an inlet 46. The inlet 46 is positioned at an opposite edge of the sensor window 36 from the first air nozzle 38. The first air nozzle 38 is aimed at the inlet 46.

The sensor apparatus 32 provides a way to efficiently dissipate heat generated by the sensor 34 and to prevent external heat from being absorbed by the sensor apparatus 32. The cover 44 forms a route for airflow from the first air nozzle 38 to pass over the heat-dissipation fins 42 and absorb heat generated by the sensor 34, thus removing the heat from the sensor apparatus 32. The cover 44 and the first air nozzle 38 are arranged so that the field of view of the sensor 34 through the sensor window 36 is unobstructed. The cover 44 can also shield the surface 40 of the sensor apparatus 32 from sunlight. The sensor apparatus 32 provides these benefits with a small number of generally nonmoving parts.

With reference to FIG. 1, the vehicle 30 may be any passenger or commercial automobile such as a car, a truck, a sport utility vehicle, a crossover, a van, a minivan, a taxi, a bus, etc.

The vehicle 30 may be an autonomous vehicle. A computer can be programmed to operate the vehicle 30 independently of the intervention of a human driver, completely or to a lesser degree. The computer may be programmed to operate propulsion, brake system, steering, and/or other vehicle systems based at least in part on data received from sensors such as the sensor 34 described below. For the purposes of this disclosure, autonomous operation means the computer controls the propulsion, brake system, and steering without input from a human driver; semi-autonomous operation means the computer controls one or two of the propulsion, brake system, and steering and a human driver controls the remainder; and nonautonomous operation means a human driver controls the propulsion, brake system, and steering.

The vehicle 30 includes a body 48. The vehicle 30 may be of a unibody construction, in which a frame and the body 48 of the vehicle 30 are a single component. The vehicle 30 may, alternatively, be of a body-on-frame construction, in which the frame supports the body 48, which is a separate component from the frame. The frame and body 48 may be formed of any suitable material, for example, steel, aluminum, etc.

The body 48 includes body panels 50 partially defining an exterior of the vehicle 30. The body panels 50 may present a class-A surface, e.g., a finished surface exposed to view by a customer and free of unaesthetic blemishes and defects. The body panels 50 include, e.g., a roof 52, etc.

Figure 2:
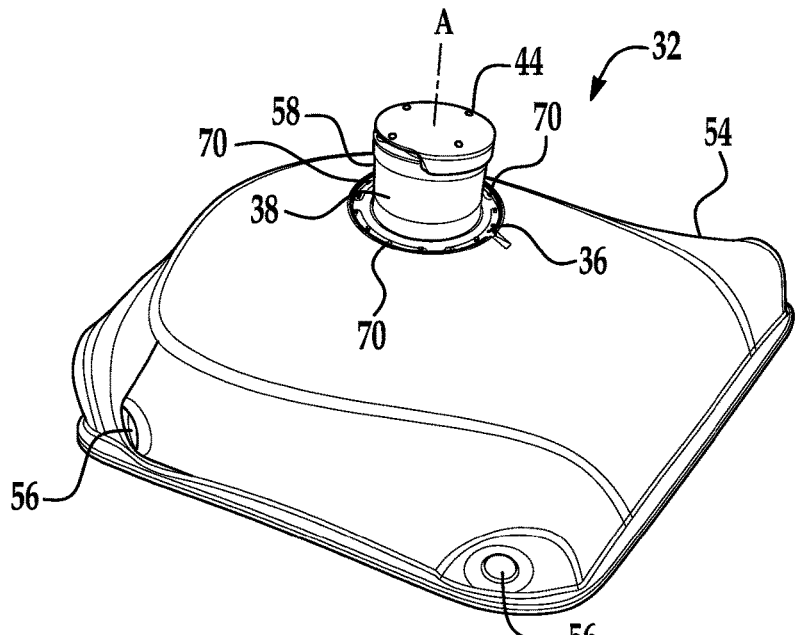
FIG. 2 is a rear perspective view of the housing.

With reference to FIG. 2, a housing 54 for the sensor 34 and other sensors 56 is attachable to the vehicle 30, e.g., to one of the body panels 50 of the vehicle 30, e.g., the roof 52. For example, the housing 54 may be shaped to be attachable to the roof 52, e.g., may have a shape matching a contour of the roof 52. The housing 54 may be attached to the roof 52, which can provide the sensors 34, 56 with an unobstructed field of view of an area around the vehicle 30. The housing 54 may be formed of, e.g., plastic or metal.

A sensor housing 58 is supported by the housing 54. The sensor housing 58 can be disposed on top of the housing 54 at a highest point of the housing 54. The sensor housing 58 has a cylindrical shape and defines an axis A.

Figure 3:
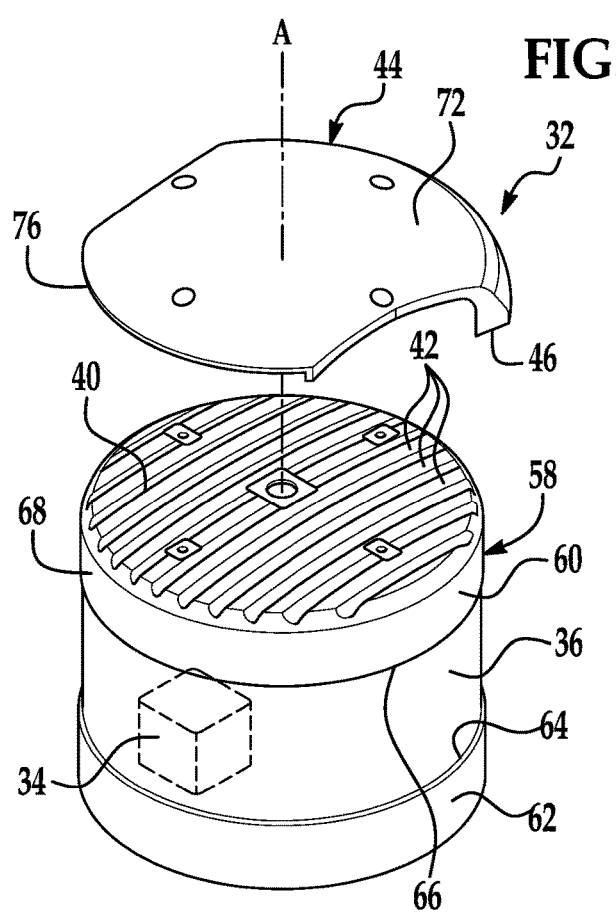
FIG. 3 is an exploded perspective view of an example sensor housing and cover.

With reference to FIG. 3, the sensor housing 58 includes a sensor-housing top 60, the sensor window 36, and a sensor-housing bottom 62. The sensor-housing top 60 is disposed directly above the sensor window 36, and the sensor-housing bottom 62 is disposed directly below the sensor window 36. The sensor-housing top 60 and the sensor-housing bottom 62 are vertically spaced apart by a height of the sensor window 36.

The sensor 34 is disposed inside the sensor housing 58 and is attached to and supported by the housing 54. The sensor 34 may be designed to detect features of the outside world; for example, the sensor 34 may be a radar sensor, a scanning laser range finder, a light detection and ranging (LIDAR) device, or an image processing sensor such as a camera. In particular, the sensor 34 may be a LIDAR device, e.g., a scanning LIDAR device. A LIDAR device detects distances to objects by emitting laser pulses at a particular wavelength and measuring the time of flight for the pulse to travel to the object and back. The sensor 34 has a field of view encompassing a region from which the sensor 34 receives input.

The sensor window 36 is cylindrical and defines the axis A, which is oriented substantially vertically. The sensor window 36 extends around the axis A. The sensor window 36 can extend fully around the axis A, i.e., 360°, or partially around the axis A. The sensor window 36 extends along the axis A from a bottom edge 64 to a top edge 66. The bottom edge 64 contacts the sensor-housing bottom 62, and the top edge 66 contacts the sensor-housing top 60. The sensor window 36 has an outer diameter. The outer diameter of the sensor window 36 may be the same as an outer diameter of the sensor-housing top 60 and/or of the sensor-housing bottom 62; in other words, the sensor window 36 may be flush or substantially flush with the sensor-housing top 60 and/or the sensor-housing bottom 62. "Substantially flush" means a seam between the sensor window 36 and the sensor-housing top 60 or sensor-housing bottom 62 does not cause turbulence in air flowing along the sensor window 36. At least some of the sensor window 36 is transparent with respect to whatever medium the sensor 34 is capable of detecting. For example, if the sensor 34 is a LIDAR device, then the sensor window 36 is transparent with respect to visible light at the wavelength generated by the sensor 34. The field of view of the sensor 34 extends through the sensor window 36. As explained more fully below, the sensor window 36 is unobstructed from the bottom edge 64 to the top edge 66.

The sensor-housing top 60 is cylindrical in shape and defines the axis A. The sensor-housing top 60 extends upward from the sensor window 36. The sensor-housing top 60 is mounted to and fixed relative to the sensor window 36. The sensor-housing top 60 is positioned to receive heat generated by the sensor 34; for example, the sensor-housing top 60 is directly above the sensor 34, and convection transfers heat via the air inside the sensor housing 58 from the sensor 34 to the sensor-housing top 60.

The sensor-housing top 60 includes a lateral surface 68 and the surface 40. The surface 40 faces up, i.e., in a vehicle-upward direction, i.e., axially relative to the axis A, and the lateral surface 68 faces horizontally outward, i.e., radially relative to the axis A. The lateral surface 68 extends vertically upward from the top edge 66 of the sensor window 36 to the surface 40. The surface 40 extends transverse to the lateral surface 68. The top edge 66 of the sensor window 36 is spaced from the surface 40 by a height of the lateral surface 68.

The surface 40 has a circular shape and is centered on the axis A. The surface 40 is oriented orthogonal to the axis A. A highest point of the surface 40 is at a center of the surface 40, i.e., a point at which the axis A intersects the surface 40. A slope of the surface 40 (neglecting the heat-dissipation fins 42) is horizontal at the center point. The surface 40 slopes gradually downward in a radially outward direction from the center point, i.e., from the axis A. The slope of the surface 40 is closer to horizontal closer to the center point and is steeper farther from the center point.

The surface 40 includes a plurality of the heat-dissipation fins 42. The heat-dissipation fins 42 extend upward from the rest of the surface 40, and the heat-dissipation fins 42 are oriented parallel to each other. The heat-dissipation fins 42 can be oriented along a vehicle-forward direction. The heat-dissipation fins 42 are thermally conductive, i.e., have a high thermal conductivity, e.g., a thermal conductivity equal to at least 15 watts per meter-Kelvin (W/(m K)), e.g., greater than 100 W/(m K), at 25° C. For example, the heat-dissipation fins 42 may be aluminum.

Returning to FIG. 2, the sensor apparatus 32 includes the first air nozzle 38 and a plurality of second air nozzles 70. The air nozzles 38, 70 are mounted on the housing 54. The air nozzles 38, 70 are positioned below the sensor window 36 and are arranged circumferentially around the sensor housing 58. The first air nozzle 38 is positioned in a directly vehicle-rearward direction from a center of the sensor housing 58, i.e., in a directly vehicle-rearward direction from the axis A. The second air nozzles 70 are positioned forward from the first air nozzle 38. The air nozzles 38, 70 are aimed upward, e.g., aimed in a direction parallel to the axis A. The air nozzles 38, 70 can receive airflow from, e.g., a compressor or blower (not shown). The air nozzles 38, 70 are open to the ambient environment.

Figure 4:
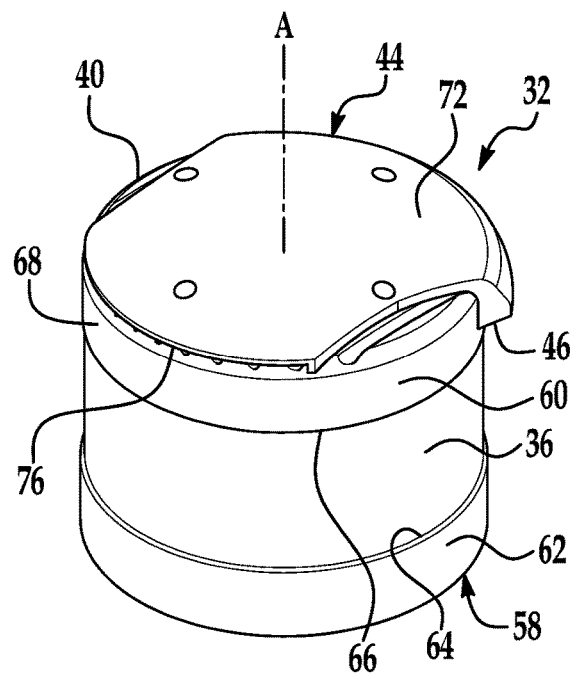
FIG. 4 is a perspective view of the sensor housing and the cover.

With reference to FIG. 4, the cover 44 extends over the fins. The cover 44 extends along and conceals at least most of the surface 40, e.g., at least 75% of the surface 40, e.g., an entirety of the surface 40, and the cover 44 extends along and conceals a portion of the lateral surface 68, e.g., a rearmost portion of the lateral surface 68. The cover 44 includes a cover top surface 72 facing generally upward. A contour of the cover 44, specifically, of the cover top surface 72, matches a contour of the surface 40; e.g., the cover top surface 72 has a highest point where the axis A intersects the cover top surface 72, and the cover top surface 72 has a gradual downward slope radially outward from the axis A. The slope of the cover top surface 72 is closer to horizontal closer to the axis A and is steeper farther from the axis A.

The cover 44 is a thermally conductive polymer, i.e., a polymer with high thermal conductivity for a polymer, e.g., a thermal conductivity equal to at least 1.0 watts per meter-Kelvin (W/(m K)), e.g., greater than 5 W/(m K), at 25° C.

Figure 5A:
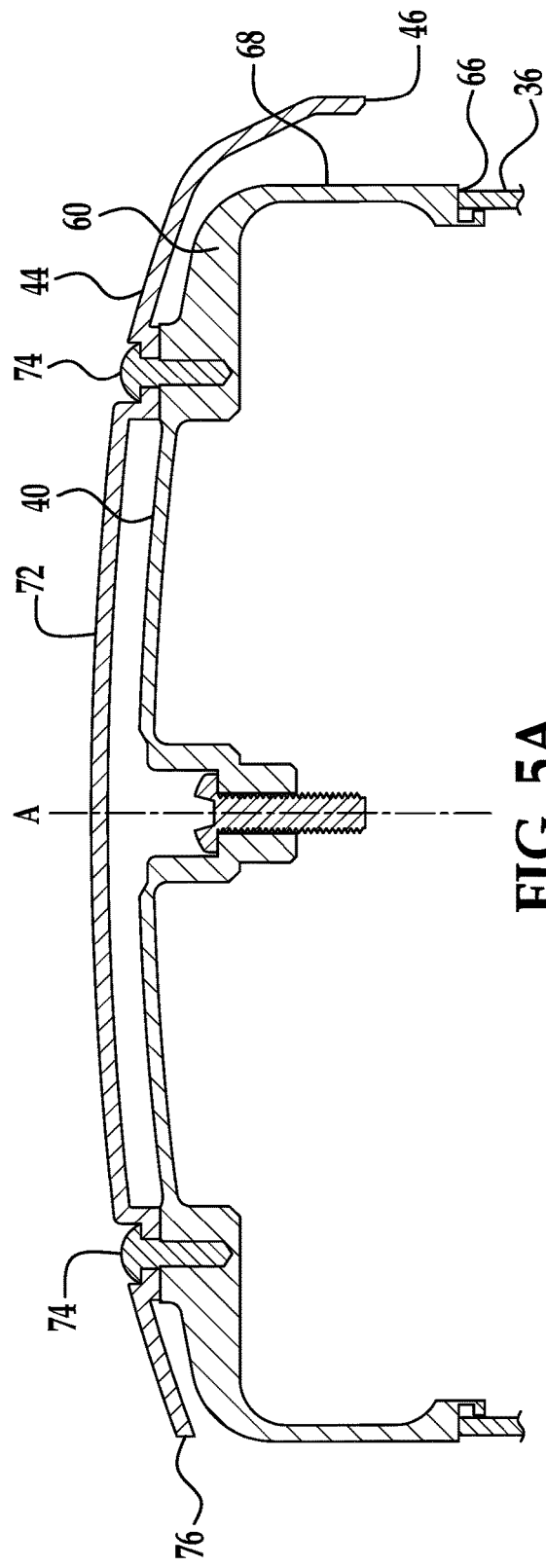
FIG. 5A is a side cross-sectional view of a portion of the sensor housing and the cover.
Figure 5B:
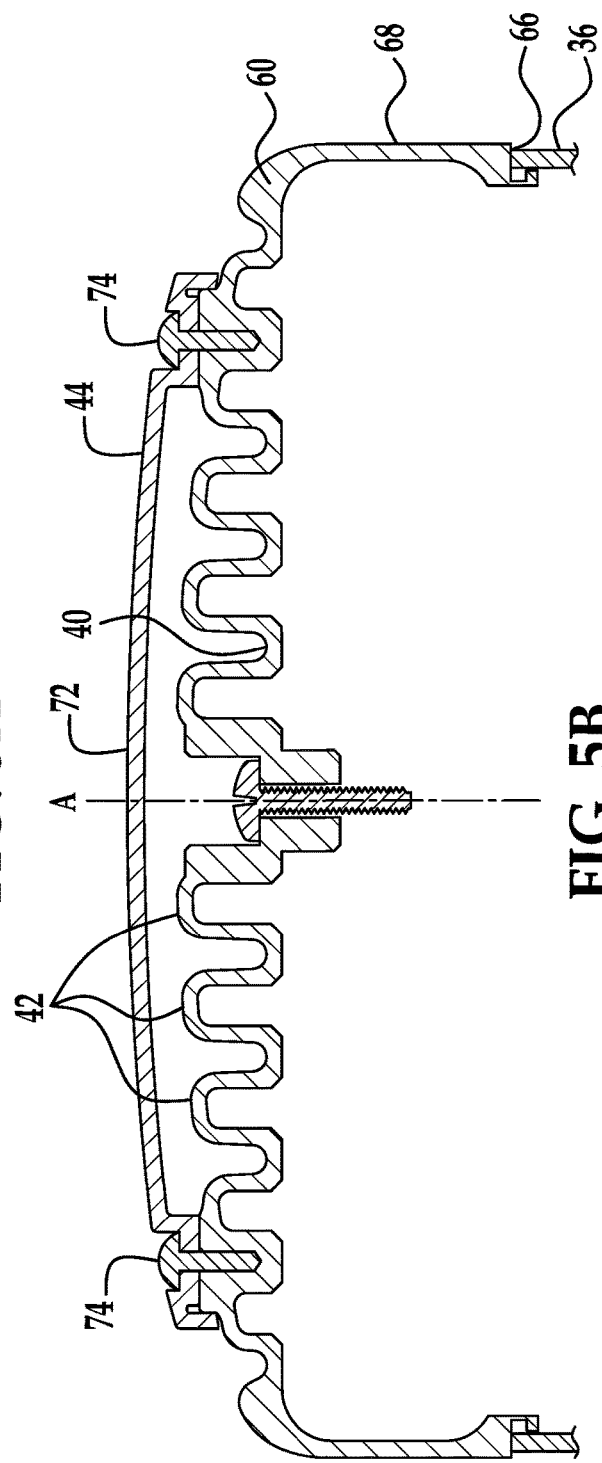
FIG. 5B is a front cross-sectional view of a portion of the sensor housing and the cover.

With reference to FIGS. 5A-B, the cover 44 is fixed relative to the sensor-housing top 60. For example, as shown in the Figures, the cover 44 is bolted onto the sensor-housing top 60 by bolts 74 extending through the cover 44 and into the sensor-housing top 60.

The cover 44 includes the inlet 46. The inlet 46 is positioned below the surface 40 and at, e.g., slightly above, the top edge 66 of the sensor window 36. The cover 44 extends from the inlet 46 upward over the lateral surface 68 to the surface 40. The inlet 46 is a lowest point of the cover 44 and is at a rearmost portion of the cover 44. The inlet 46 is positioned at an opposite edge of the sensor window 36 from the first air nozzle 38; i.e., the sensor window 36 is between the inlet 46 and the first air nozzle 38 along a direction parallel to the sensor window 36; e.g., the inlet 46 is positioned at the top edge 66 of the sensor window 36, and the first air nozzle 38 is positioned below the bottom edge 64 of the sensor window 36.

Figure 6A:
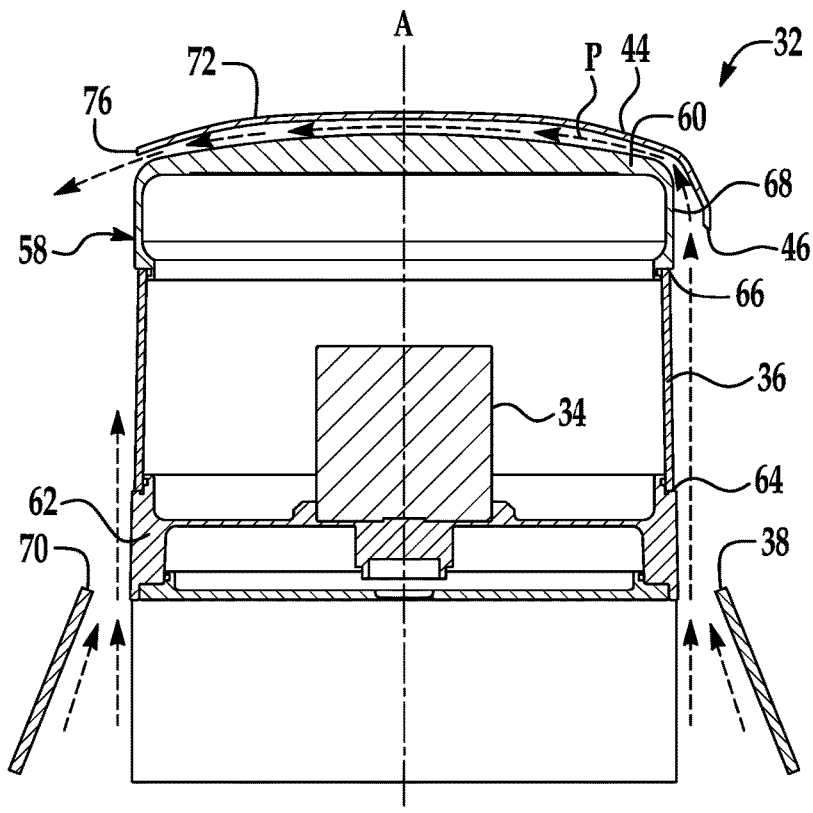
FIG. 6A is a side cross-sectional view of the sensor housing and the cover when the vehicle is traveling at a low speed.
Figure 6B:
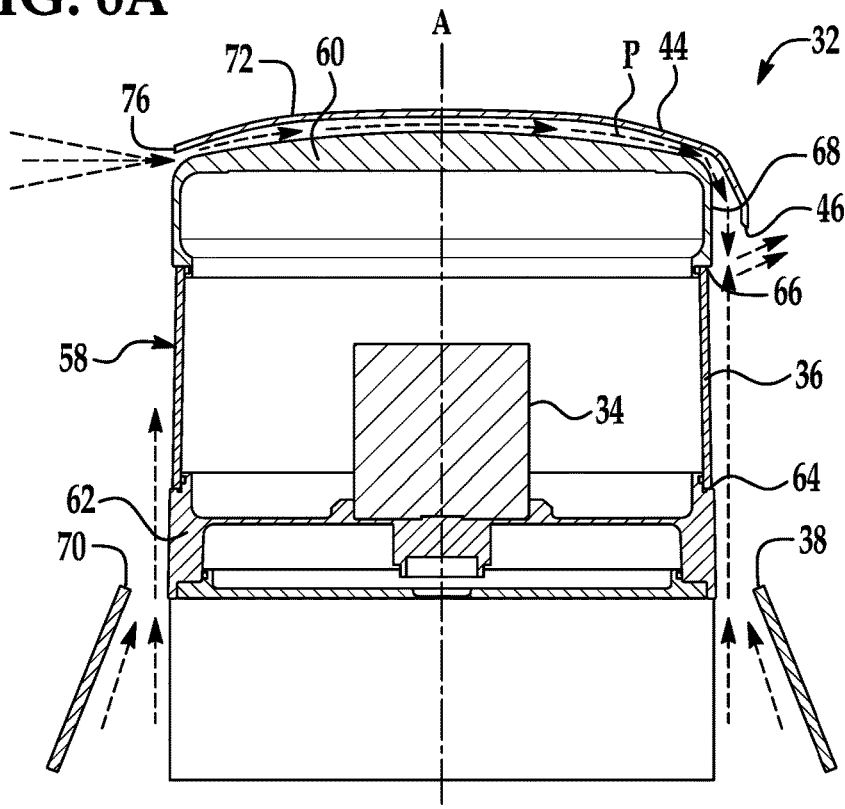
FIG. 6B is a side cross-sectional view of the sensor housing and the cover when the vehicle is traveling at a high speed.

With reference to FIGS. 6A-B, the first air nozzle 38 is aimed at the inlet 46; in other words, a direction of discharge of the first air nozzle 38 intersects the inlet 46. For example, the first air nozzle 38 has a direction of discharge straight vertically upward, and the inlet 46 is positioned directly above the first air nozzle 38. The inlet 46 faces toward the first air nozzle 38, e.g., downward. The inlet 46 is open to the ambient environment, and airflow from the first air nozzle 38 to the inlet 46 is exposed to the ambient environment. The sensor window 36 is unobstructed from the bottom edge 64 to the top edge 66; e.g., no structures extend along the sensor window 36 between the first air nozzle 38 and the inlet 46.

The cover 44 includes an outlet 76. The outlet 76 is positioned at a forwardmost portion of the cover 44. The outlet 76 extends upward from the surface 40. The outlet 76 faces in the vehicle-forward direction. The outlet 76 defines an opening that can have a horizontal width at least as great as half a diameter of the surface 40, as best seen in FIGS. 3 and 4.

Figure 7:
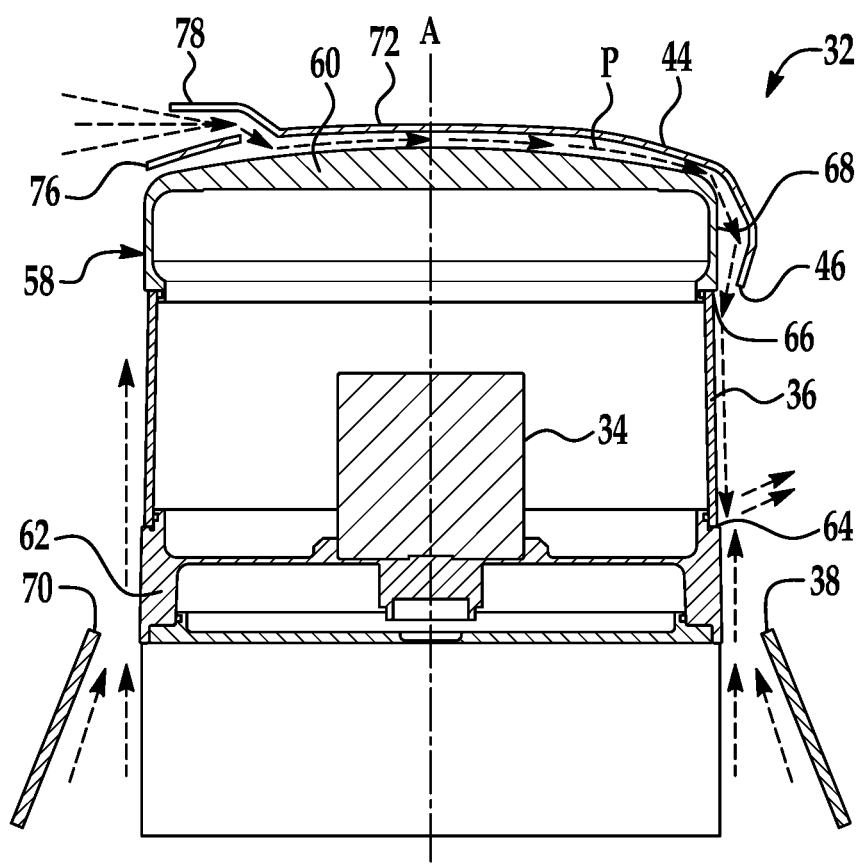
FIG. 7 is a side cross-sectional view of the sensor housing with another example cover.

With reference to FIG. 7, the cover 44 may include a ram-air intake 78. The ram-air intake 78 extends upward from the portion of the cover 44 matching the surface 40. The ram-air intake 78 is positioned forward of the axis A. The ram-air intake 78 faces in the vehicle-forward direction.

With reference to FIGS. 6A-7, the cover 44 forms an airflow path P between the inlet 46 and the outlet 76. The airflow path P extends upward from the inlet 46 along the lateral surface 68 to the surface 40 and then along the surface 40 in the vehicle-forward direction to the outlet 76. The heat-dissipation fins 42 are elongated along the airflow path P, i.e., a direction of airflow along the surface 40 is the same as a direction of elongation of the fins along the surface 40, e.g., the vehicle-forward direction. A vertical distance from a top of the fins to the cover 44 is generally constant along the airflow path P.

In operation, when the vehicle 30 is stopped or traveling at a low speed as shown in FIG. 6A, the first air nozzle 38 and the second air nozzles 70 blow air upward along the sensor window 36. The airflow can form an air curtain that prevents debris from hitting the sensor window 36 or blows debris off of the sensor window 36. The airflow from the first air nozzle 38 enters the inlet 46 and travels along the airflow path P to the outlet 76. The airflow absorbs heat generated by the sensor 34 via convection from the surface 40 and the heat-dissipation fins 42 and carries that heat away from the sensor apparatus 32. The cover 44 can reflect sunlight and thus at least partially prevent the sensor-housing top 60 from absorbing heat from the sunlight.

When the vehicle 30 is traveling at a high speed as shown in FIGS. 6B and 7, ram air enters the outlet 76 and, if present, the ram-air intake 78. The airflow from the movement of the vehicle 30 then travels along the airflow path P in the opposite direction as before, and the airflow exits through the inlet 46. The airflow absorbs heat generated by the sensor 34 via the surface 40 and via the heat-dissipation fins 42 and carries that heat away from the sensor apparatus 32. The first air nozzle 38 and the second air nozzles 70 blow air upward along the sensor window 36, but the airflow exiting the inlet 46 counteracts the airflow from the first nozzle and prevents the airflow from the first air nozzle 38 from entering the inlet 46.

The disclosure has been described in an illustrative manner, and it is to be understood that the terminology which has been used is intended to be in the nature of words of description rather than of limitation. The adjectives "first" and "second" are used throughout this document as identifiers and are not intended to signify importance, order, or quantity. "Substantially" as used herein means that a dimension, time duration, shape, or other adjective may vary slightly from what is described due to physical imperfections, power interruptions, variations in machining or other manufacturing, etc. Terms such as "front," "forward," "back," "rearward," "left," "right," "side," etc., are understood relative to the vehicle 30. Many modifications and variations of the present disclosure are possible in light of the above teachings, and the disclosure may be practiced otherwise than as specifically described.

What is claimed is:

1. A sensor apparatus comprising:
   a sensor having a field of view;
   a sensor window through which the field of view extends, the sensor window extending vertically from a bottom edge to a top edge;
   an air nozzle positioned below the bottom edge and oriented to direct airflow vertically upward across the sensor window;
   a surface fixed relative to the sensor window, the surface including a plurality of heat-dissipation fins; and
   a cover extending over the heat-dissipation fins and including an inlet;
   wherein the inlet is positioned above the top edge of the sensor window and is oriented to receive airflow from the air nozzle;
   the air nozzle is aimed at the inlet; and
   the sensor window is unobstructed from the bottom edge to the top edge along an airflow path from the air nozzle to the inlet.

2. The sensor apparatus of claim 1, wherein the air nozzle is directly open to an ambient environment, and the inlet is directly open to the ambient environment.

3. The sensor apparatus of claim 1, wherein the cover includes an outlet and forms an airflow path between the inlet and the outlet, and the fins are elongated along the airflow path.

4. The sensor apparatus of claim 3, wherein the sensor window is mounted to a body panel of a vehicle, and the fins are elongated along a vehicle-forward direction.

5. The sensor apparatus of claim 4, wherein the outlet faces in the vehicle-forward direction.

6. The sensor apparatus of claim 1, wherein the surface is positioned to receive heat generated by the sensor.

7. The sensor apparatus of claim 1, wherein the sensor window is cylindrical.

8. The sensor window of claim 7, wherein the sensor window defines an axis, and the surface is centered on the axis.

9. The sensor window of claim 8, wherein the surface is oriented orthogonal to the axis.

10. The sensor apparatus of claim 1, further comprising a sensor-housing top including the surface, wherein the sensor-housing top is mounted to the sensor window.

11. The sensor apparatus of claim 10, wherein the sensor-housing top includes a lateral surface extending vertically upward from the top edge of the sensor window, and the surface extends transverse from the lateral surface.

12. The sensor apparatus of claim 11, wherein the cover extends from the inlet over the lateral surface and forms an airflow path from the inlet to the fins.

13. The sensor apparatus of claim 1, wherein a contour of the cover matches a contour of the surface.

14. The sensor apparatus of claim 1, wherein the sensor window is mounted to a body panel of a vehicle, the cover includes an outlet and forms an airflow path between the inlet and the outlet, and the outlet is oriented such that ram air from forward travel of the vehicle enters the outlet and exits through the inlet.

* * * * *